US012400703B2

(12) United States Patent
Tan et al.

(10) Patent No.: US 12,400,703 B2
(45) Date of Patent: Aug. 26, 2025

(54) PER BANK REFRESH HAZARD AVOIDANCE FOR LARGE SCALE MEMORY

(71) Applicant: Intel Corporation, Santa Clara, CA (US)

(72) Inventors: Chang Kian Tan, Bayan Lepas (MY); Kuljit S. Bains, Olympia, WA (US); Saravanan Sethuraman, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 729 days.

(21) Appl. No.: 17/551,116

(22) Filed: Dec. 14, 2021

(65) Prior Publication Data

US 2022/0108743 A1  Apr. 7, 2022

(51) Int. Cl.
*G11C 11/40* (2006.01)
*G11C 11/406* (2006.01)
*G11C 11/4093* (2006.01)
*G11C 11/4096* (2006.01)

(52) U.S. Cl.
CPC .. *G11C 11/40622* (2013.01); *G11C 11/40615* (2013.01); *G11C 11/4093* (2013.01); *G11C 11/4096* (2013.01)

(58) Field of Classification Search
CPC ........ G11C 11/40622; G11C 11/40615; G11C 11/4093
See application file for complete search history.

(56) References Cited

U.S. PATENT DOCUMENTS

| 2021/0264999 A1* | 8/2021 | Bains | G11C 7/24 |
| 2024/0013839 A1* | 1/2024 | Upadhyay | G11C 16/102 |

* cited by examiner

Primary Examiner — Han Yang
(74) Attorney, Agent, or Firm — Compass IP Law PC

(57) ABSTRACT

An apparatus is described. The apparatus includes a memory controller having a network interface and a channel interface. The channel interface is to send read, write and refresh commands into a region of a memory. The network interface is to receive memory access requests from a network, wherein the memory requests target the region of the memory. The memory requests are sent into the network by one or more host interfaces. The memory controller has bank refresh logic circuitry. The memory controller has signaling logic circuitry to send a back pressure signal to the one or more host interfaces. The back pressure signal identifies a bank of the region of the memory that is about to be refreshed by the bank refresh logic circuitry. The back pressure signal is to inform the one or more host interfaces that any memory requests that target the bank will not be serviced by the region of memory before the bank begins to be refreshed.

20 Claims, 8 Drawing Sheets

PER BANK REFRESH HAZARD AVOIDANCE FOR LARGE SCALE MEMORY

FIELD OF INVENTION

The field of invention pertains generally to the computing sciences, and, more specifically, to per bank refresh hazard avoidance for large scale memory.

BACKGROUND

With the emergence of big data, low latency access to large volumes of information is becoming an increasingly important parameter of the performance and/or capability of applications that process or otherwise use large volumes of information. As such, system designers are constantly seeking ways to improve access to large memory spaces.

FIGURES

Figure 1:
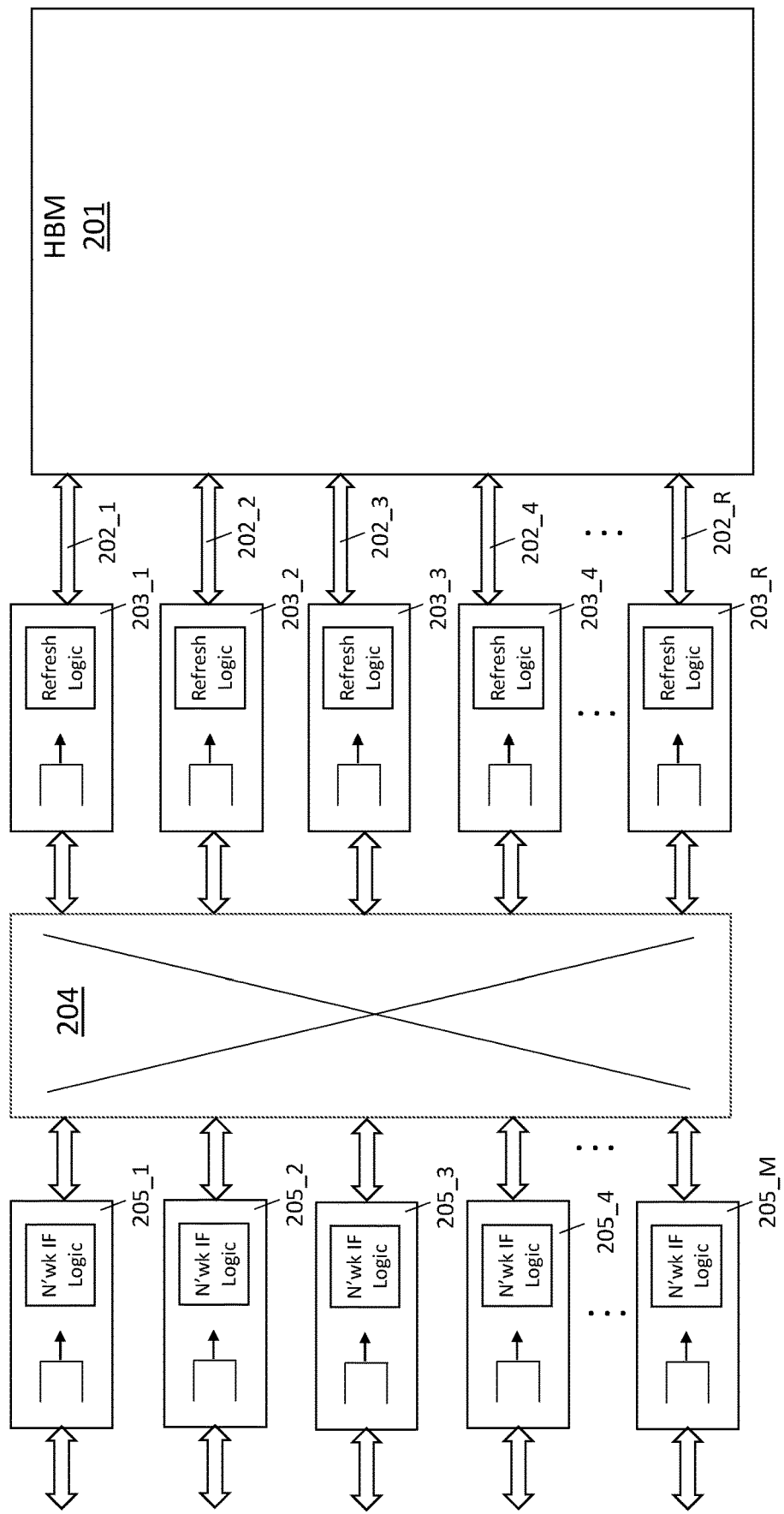
Figure 2:
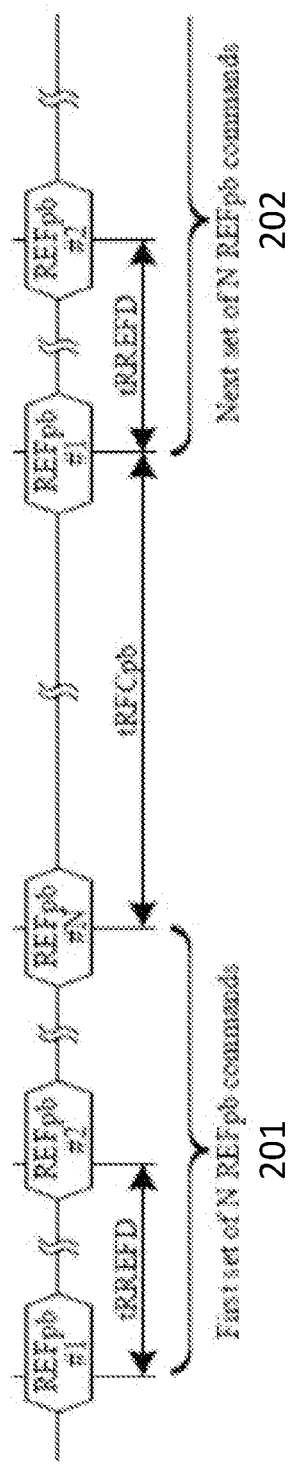
Figure 3:
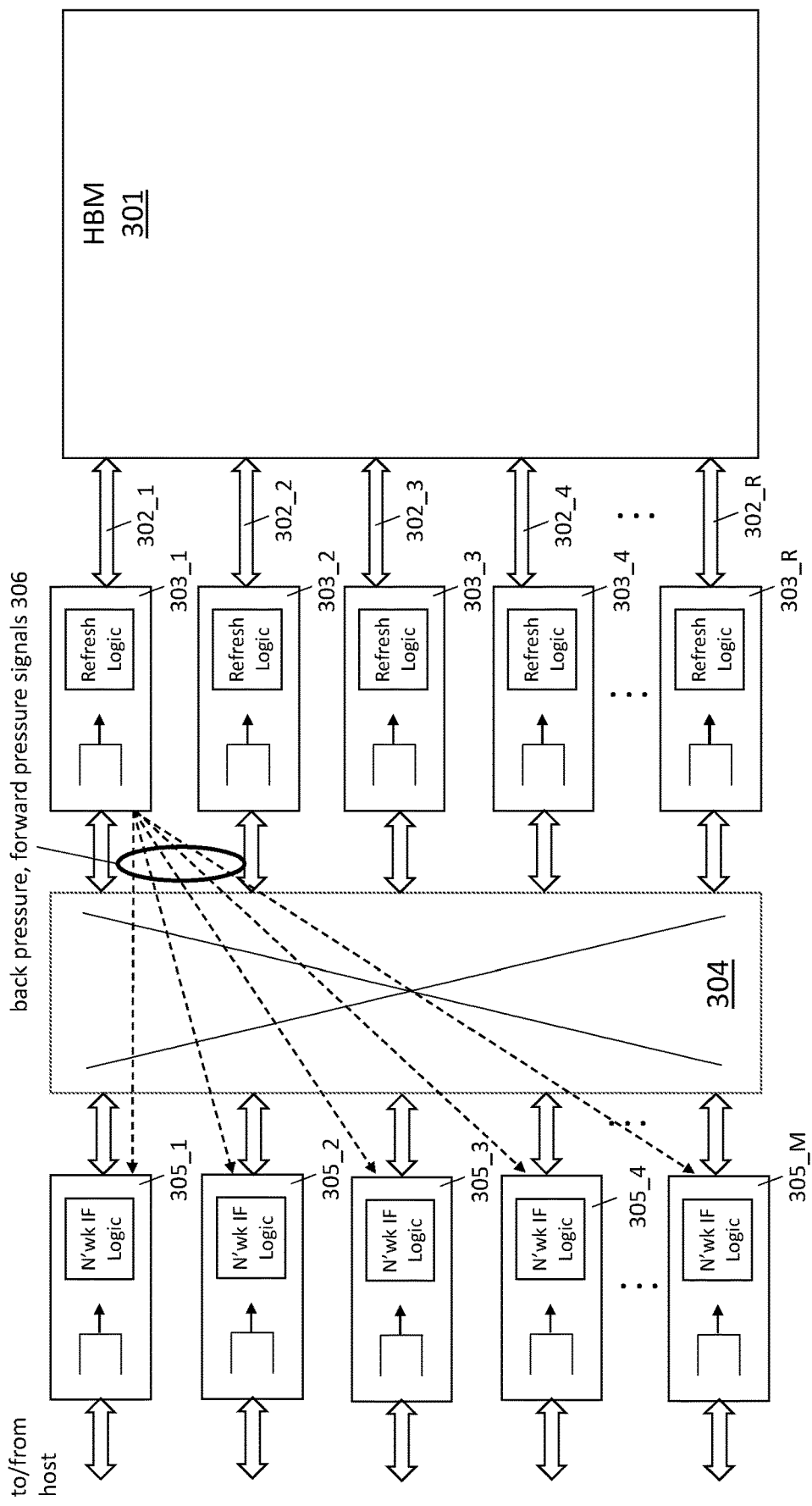
Figure 4:
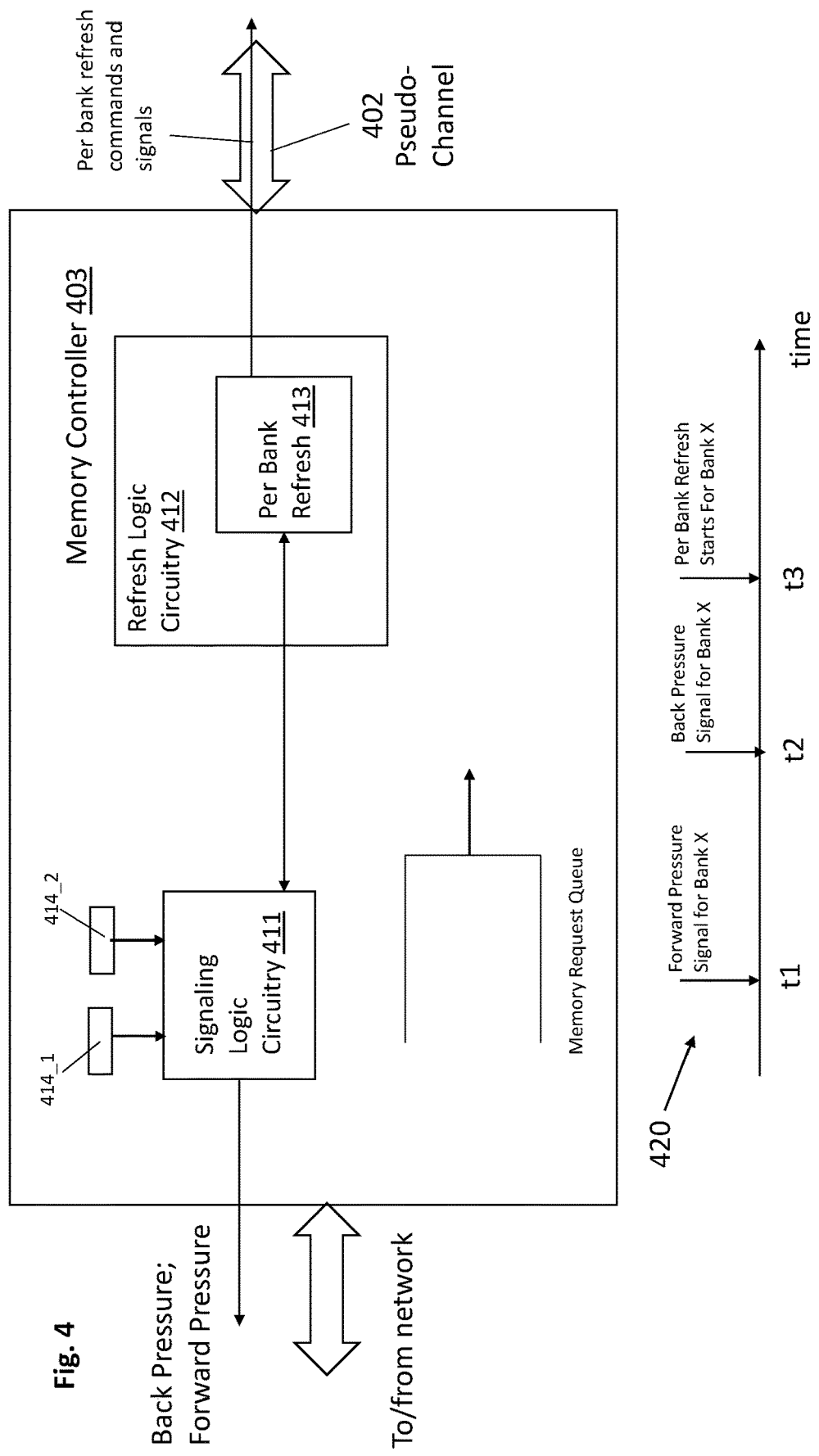
Figure 5:
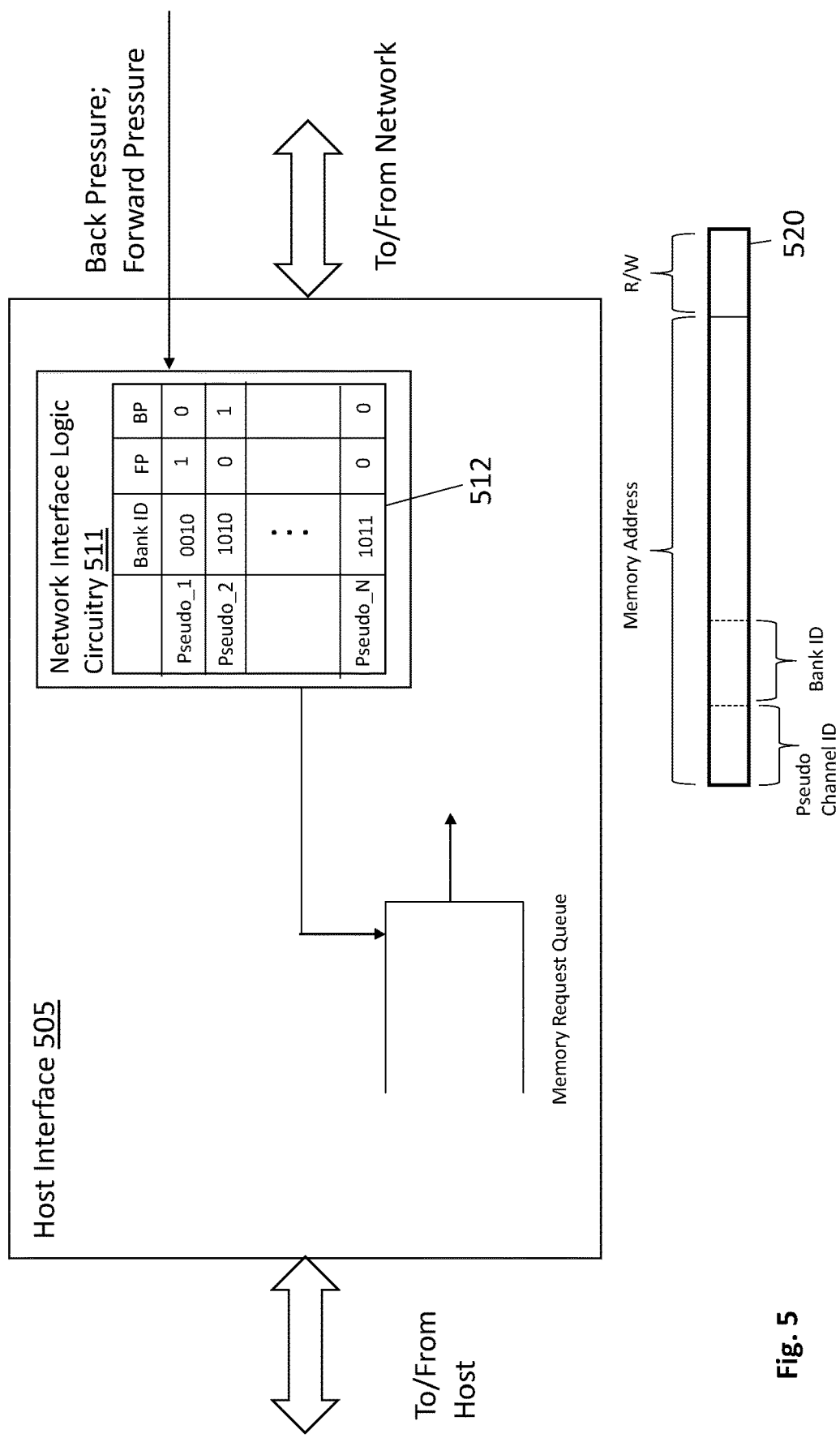
Figure 6:
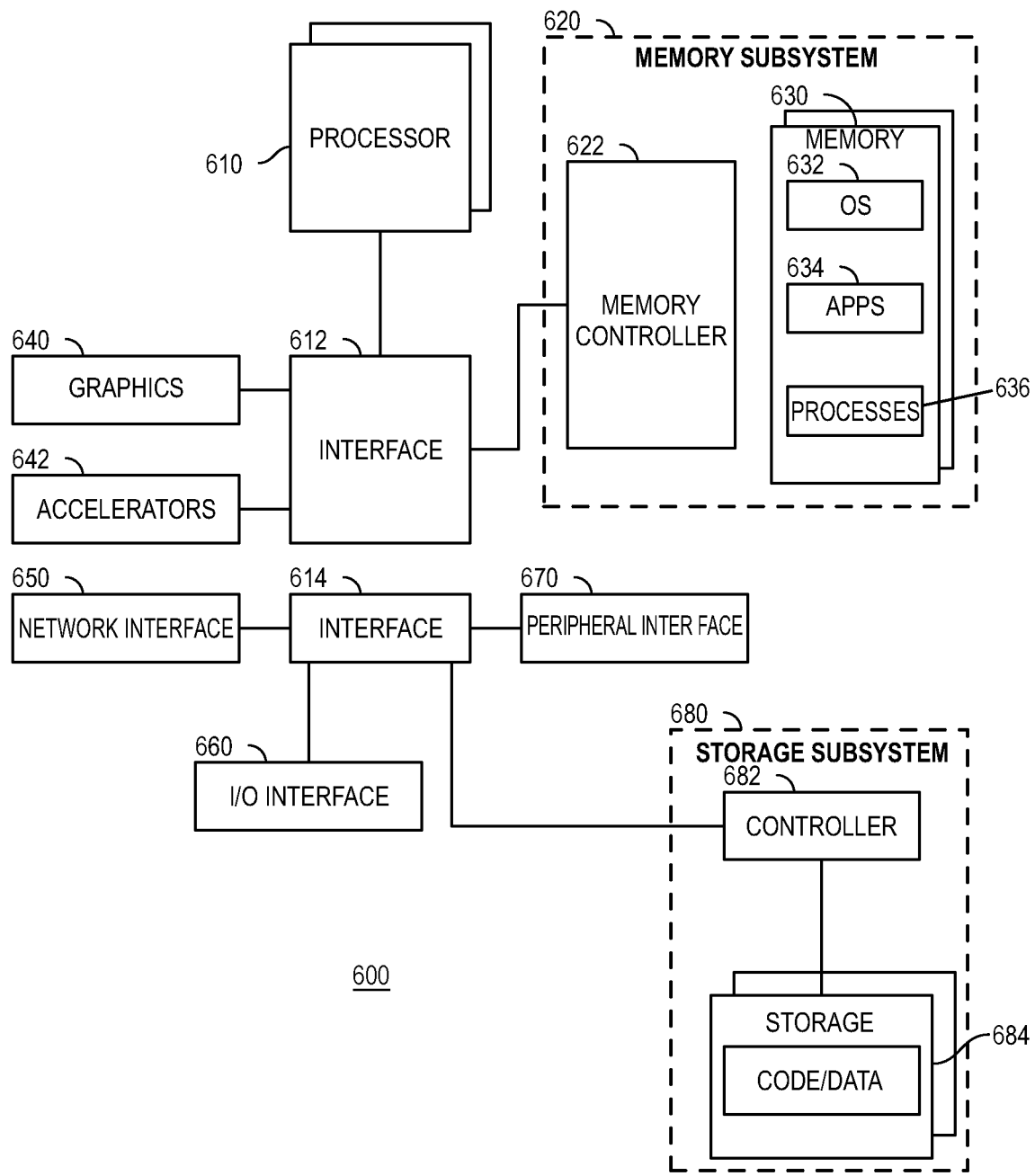
Figure 7:
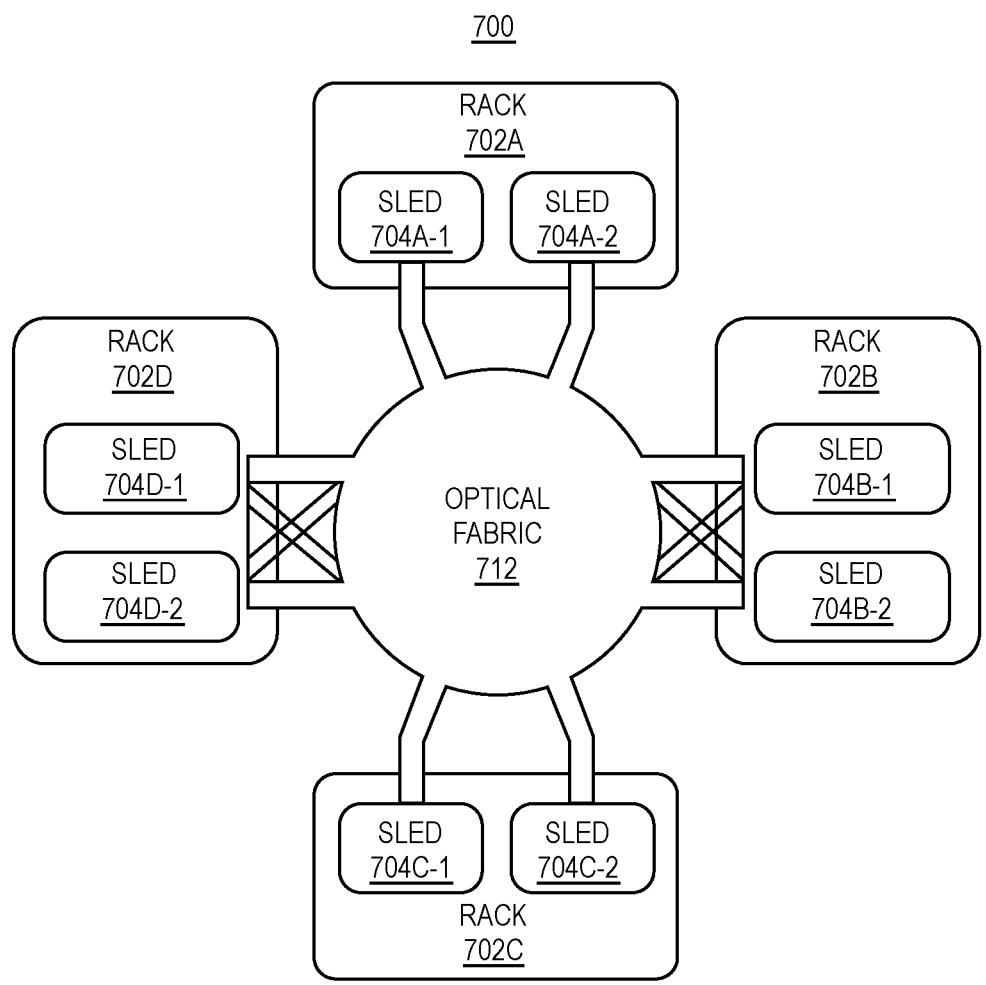
Figure 8:
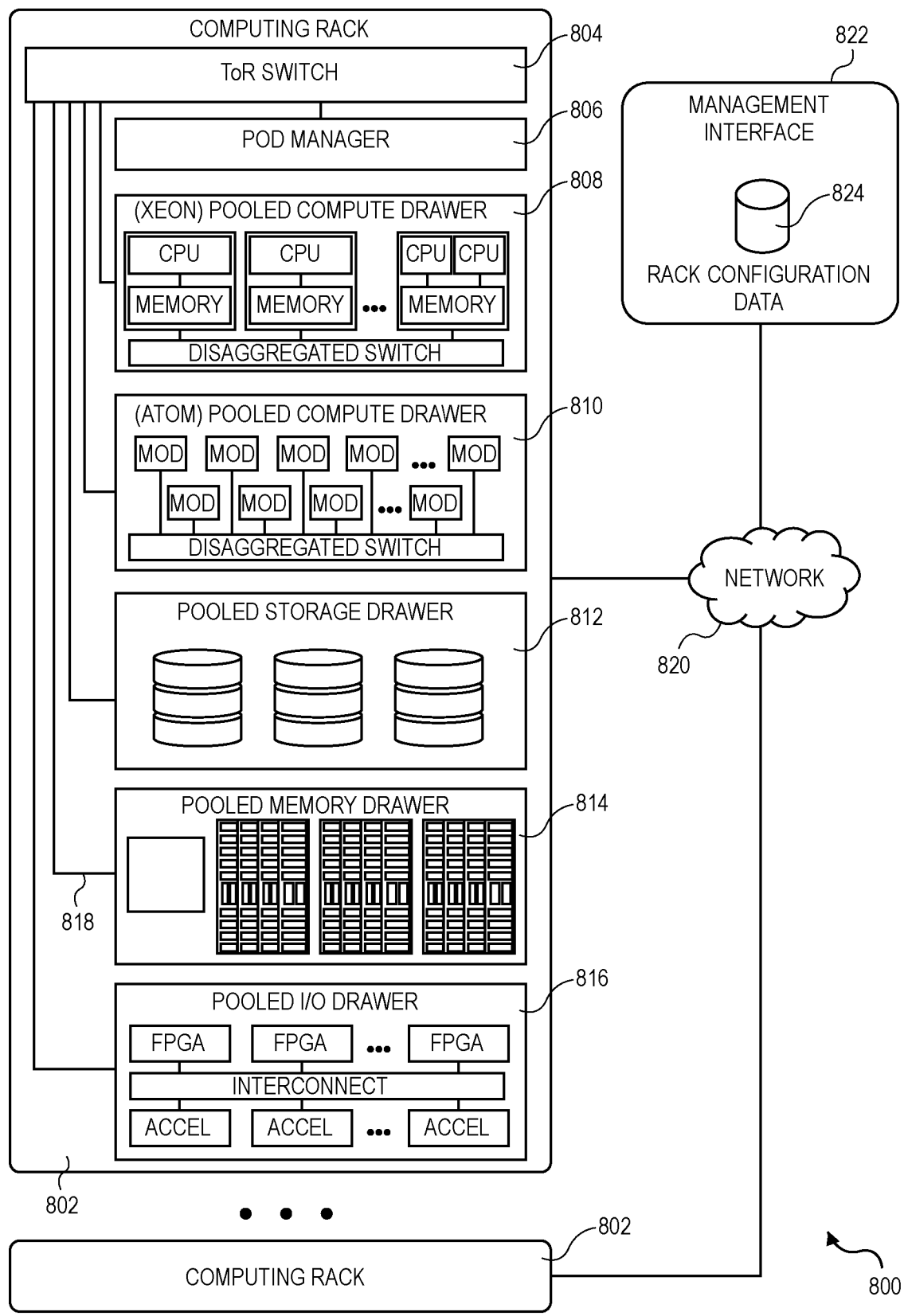

FIG. 1 shows a memory access architecture (prior art);
FIG. 2 shows bank refresh timing;
FIG. 3 shows an improved memory access architecture;
FIG. 4 shows an improved memory controller;
FIG. 5 shows an improved host interface;
FIG. 6 shows a computer system;
FIG. 7 shows a data center;
FIG. 8 shows a rack.

DETAILED DESCRIPTION

FIG. 1 shows an architecture for accessing a large memory such as a High Bandwidth Memory (HBM) module 201 (HBM memory is described in specification JESD235, or versions thereof, published by the Joint Electron Device Engineering Council (JEDEC)). An HBM module 201 is a stacked memory chip solution that physically stacks high density dynamic random access memory (DRAM) chips on top of one another in a single package 201. The immense memory capacity with the package 201 is broken down into R different regions, where, each region has its own dedicated pseudo-channel 202_1-202_R and memory controller 203_1-203_R for accessing the region.

A particular region of the memory is accessed by sending a memory request to the memory controller associated with that region's pseudo-channel. For example, if data is to be written into or read from a $1^{st}$ region of the HBM memory 201, a memory request is sent to memory controller 203_1. In response, the memory controller 203_1 will send the corresponding write/read command into the $1^{st}$ region of the HBM 201 along pseudo-channel 202_1. By contrast, if data is to be written into or read from a $2^{nd}$ region of the HBM memory 201, a memory request is sent to memory controller 203_2. In response, memory controller 203_2 will send the corresponding write/read command into the $2^{nd}$ region of HBM memory 201 along pseudo-channel 202_2.

The R different regions of memory are assigned different memory address ranges so that the entire HBM memory 201 appears as continuous addressable memory space. A network 204 (e.g., a network on chip NoC)) is inserted between a number of host interfaces 205_1-205_M to direct memory requests received by the host interfaces to the correct memory controller and pseudo-channel based on the memory requests' respective memory addresses. Here, the host interfaces 205_1-205_M are interfaces to the HBM memory 201 that components of a larger host system (e.g., CPUs, GPUS, XPUs, NPUs, of a computer system or network system, etc.) send their memory requests to in order to access the HBM memory 201.

Here, for example, the upper bits of the memory address within a memory request, as received at any of the host interfaces 205_1-205_M, specify which one of the N regions in HBM memory 201 is being targeted by the memory request. The host interface logic of the host interface 205 that received the memory requests forwards the request into the network 204. The network 204 uses these upper bits as a destination address and routes the memory request to the correct memory controller 203 and pseudo channel 202 for the region specified by the upper memory address bits. In this way, any system component that is communicatively coupled to any one of the host interfaces 205_1-205_M can view the entire HBM memory 201 as continuous address space and access any of its N regions.

In general, the host interfaces 205_1-205_M each include respective queues to temporarily store incoming memory requests. Here, as a host interface receives memory requests, its stores them in order in its queue. The memory requests are then serviced from the queue by the network 204 as the network 204 is able to service them. As discussed above, the memory requests are directed to the correct memory controller 203 based on the upper bits of their respective memory addresses and is entered into the queue of the memory controller 203. The memory controller 203 than services the requests from its queue as the HBM memory resources associated with the memory controller's pseudo-channel 201 are able to respond to them.

A problem is that the memory capacity within the overall HBM memory stack 201 is becoming larger and larger making per bank memory refreshes longer and longer (not only is the number of chips in the stack increasing but so is the memory cell density of the memory chips themselves). Here, a different set of N memory banks within the HBM memory 201 are uniquely assigned to each pseudo-channel 202. Being composed of DRAM memory cells, the memory banks need to be periodically refreshed or else their stored data will become corrupted. Each memory bank can be viewed as an array of memory cells and each memory bank refresh can be viewed as a sequential operation that takes place on a row-by-row basis over the array.

As per chip memory capacity increases, the number of columns per bank array increases, which, in turn, increases the time to refresh each row, which, in turn, increases the time to refresh each bank.

FIG. 2 show the precise timing characteristics for an HBM solution. Sequence 201 corresponds to a first sequence in which all N banks of a particular pseudo-channel are refreshed. Here, the memory controller for the pseudo-channel issues per bank refresh commands (REFpb) to each of the pseudo-channel's memory banks in succession. Sequence 202 corresponds to a second, following sequence in which the same N banks are again refreshed in bank order. A time, tRFCpb, must elapse after issuance of the last bank refresh command in the first sequence 201 before the first bank refresh command for the immediately following sequence 202 can be issued.

With the increasing number of memory cells per memory chip, achieved with smaller and smaller memory cells, there are more memory cells that need to be refreshed more frequently (smaller cells require more frequent refreshing). As such, the amount of time consumed refreshing a bank is increasing (which causes tRREFpb to increase) while the number of bank refreshes per unit of time is increasing (which could cause tRFCpb to decrease).

Unfortunately, a bank of DRAM memory cells cannot be accessed while the bank is being refreshed. This can result in low memory utilization under certain, but not uncommon, memory usage conditions.

For example, referring back to FIG. 1, consider a situation where a memory bank that is associated with a particular pseudo channel 202 is being refreshed. Suddenly, a wave of memory requests that target that bank are received across all of the host interfaces 205_1 through 205_M.

The network 204 will begin to service these requests, but after a short while the queue of the memory controller 203 for the bank's pseudo channel will become full of such requests because they cannot be serviced by the memory controller until the bank's refreshing is complete. Because bank refreshing times are increasing, the memory controller's queue is apt to be full of unserviceable requests for an extended period of time.

If the memory controller's queue is full of unserviceable requests for an extended period of time, no more requests will be sent to the pseudo-channel for an extended period of time (the network 204 will stop sending memory requests to the pseudo channel's memory controller once the memory controller's queue becomes full). This has the effect of shutting down access to the entire pseudo-channel for an extended period of time even though only a single bank of the pseudo-channel is being refreshed. Shutting down an entire pseudo channel for an extended period of time will result in reduced memory bandwidth which can be unacceptable for many applications.

A solution, as observed in FIG. 3, is to insert back pressure and/or forward pressure signals 306 that are communicated from a pseudo channel's memory controller to the host interfaces 305_1-305_M based on the refreshing status of a particular bank within the pseudo channel (for ease of drawing FIG. 3 only depicts the back pressure and forward pressure signals 306 for pseudo channel 302_1 and memory controller 303_1).

In particular, the following signals 306 can be sent: 1) a back pressure signal that informs the host interfaces 305_1-305_M that a particular bank is being refreshed, or, is imminently about to be refreshed such that any requests for the bank will not be serviced by the HBM memory 301 before the refreshing activity for the bank begins; 2) a forward pressure signal that informs the host interfaces 305_1-305_M that a particular bank is about to be refreshed but some time still remains in which any requests for the bank can be serviced by the HBM memory 301 before the refreshing commences if the requests are immediately sent into the network 304.

Here, if a host interface 305 receives a back pressure signal (1) above), the host interface 305 will prevent any requests that target the bank of the pseudo channel whose memory controller send the back pressure signal from entering the network 304 until the back pressure signal is released. This includes requests that are at or toward the head of the host interface's queue and are next or nearly next to be serviced by the network 304. In this case, the host interface 305 will instead "skip over" these requests and leave them in the queue (or park them elsewhere) in favor of other requests that are deeper in the queue but do not target the particular bank that back pressure signal was sent on behalf of.

This particular response by the host interface 305 to the back pressure signal will prevent the queue of the memory controller 303 that sent the back pressure signal from filling up during the refresh of the bank. As such, the remaining banks within the corresponding pseudo-channel that are not being refreshed should remain available during the bank refresh.

By contrast, if a host interface 305 receives a forward pressure signal (2) above), it will immediately favor for issuance into the network 304 those requests that target the bank that the forward pressure was sent on behalf of, including issuing requests into the network 304 that target the bank that are behind other requests in, or are at the back of, the host interface's queue. Thus, requests that target the bank that the forward pressure signal was sent on behalf of are sent into the network 304 before other requests that precede these requests in the host interface queue and that target other banks in the same pseudo channel or other pseudo channels.

This particular response by the host interface 305 to the forward pressure signal diminishes the performance penalty of the memory bank being refreshed on account of its refresh and the back pressure signal. Thus, in cases where a great number of requests are continually being sent to the bank and reliance on the back pressure signal alone would cause too great a delay in the overall servicing of these requests, the forward pressure signal and corresponding host interface response can be used to service at least those requests that can be serviced before the bank is refreshed.

For the sake of illustrative convenience, FIG. 3 only shows the back pressure and forward pressure signals for the memory controller 303_1 and pseudo channel 302_1 for the $1^{st}$ HBM memory region being sent to each of the host interfaces 305_1-305_M. In various embodiments, the respective memory controllers 303_1-303_R for each of the pseudo channels 302_1-302_R can send back pressure and forward pressure signals to each of the host interfaces 305_1-305_M on behalf of any bank about to be refreshed in the corresponding pseudo-channel. In other alternative embodiments, the respective memory controllers of the pseudo channels only send back pressure signals and not forward pressure signals. For ease of discussion the remainder of the discussion will assume that both back pressure and forward pressure signals can be sent.

FIG. 4 shows an improved pseudo channel memory controller 403 having signaling logic circuitry 411 to generate the back pressure and forward pressure signals as described above. As observed in FIG. 4, the improved pseudo channel memory controller 403 includes refresh logic circuitry 412 including per bank refresh logic circuitry 413. The refresh logic circuitry 412 is responsible for generating refresh commands and/or signals that are sent to the memory resources associated with the memory controller's pseudo channel 402, and, comprehending and responding to any refresh related signals (if any) generated by these memory resources and sent to the memory controller 403. The per bank refresh logic circuitry 413 has similar responsibilities but are devoted to per bank refresh operations, specifically.

As observed in FIG. 4, backward pressure and forward pressure signaling logic circuitry 411 is coupled to the per bank refresh logic circuitry 413 and registers 414_1, 414_2. The coupling of the signaling logic circuitry 411 to the per bank refresh logic circuitry 413 allows the signaling logic circuitry 411 to comprehend the per bank refreshing schedule including which bank is being refreshed, which bank is next to be refreshed and the associated timing of the refreshes.

Here, the per bank refresh logic circuitry 413 includes a scheduler that determines the bank refreshing order and the timing of their respective refreshes. Signaling logic circuitry 411 is coupled to the same clock signal or timer as the scheduler and by being coupled, e.g., to certain registers or signals within the scheduler, can determine the time remaining before the refreshing activity for the next bank to be refreshed commences.

Signaling logic circuitry 411 is also coupled to registers 414_1, 414_2, which, in various embodiments, are programmed by a user or application or operating system and establish the time markers in time when both the forward pressure and back pressure signals are sent. Here, for example register 414_1 contains a value that establishes the time before the start of a refresh for a particular bank at which point a forward pressure signal is sent. By contrast, register 414_2 contains a value that establishes the time before the start of the refresh for the particular bank that the back pressure signal is sent.

As observed in inset 420, the forward pressures signal is sent before the back pressure signal for any particular bank refresh. As such, any memory requests that target the bank and that are queued or received by a host interface within time window t1 to t2 presumably have enough time to be applied to the pseudo channel 402 before the start of the refresh if they are sent to the memory controller 403 shortly after receipt of the forward pressure signal at time t1. Once the time remaining to the refresh dwindles to within window t2 to t3, however, any such memory requests are presumed to not have enough time to be applied to the pseudo channel 402 before the start of the refresh which triggers assertion of the back pressure signal at time t2. Registers 414_1, 414_2 essentially contain the t1 to t2, t1 to t3 and/or t2 to t3 time window information that the signaling logic circuitry uses to generate the forward pressure.

FIG. 5 shows an improved host interface 505 having network interface logic 511 that includes scoreboard logic circuitry 512 that the network interface logic 511 uses to modulate its offered load of memory requests to the network based on the forward pressure and back pressure signals that are sent from the pseudo channel memory controllers.

Specifically, the scoreboard circuitry 512 keeps track of the back pressure and forward pressure signal status for each next bank to be refreshed for each pseudo-channel. Here, space is reserved in the scoreboard 512 for each pseudo channel that includes: 1) identity of bank next to be refreshed (Bank_ID); 2) status of forward pressure signal (Fp); and, 3) status of back pressure signal (Bp).

Here, for any pseudo channel, in various embodiments, only one of the pseudo channel's multiple banks is the next bank to be refreshed. The identity of this bank is identified in the first field of a pseudo-channel's space in the scoreboard (Bank_ID). Here, the Bank_ID corresponds to a specific set of bits in a memory address. For example, referring to inset 520, as discussed above, a first set of highest order bits in a memory address can identify a particular pseudo-channel. Additionally, a next set of immediately lower order bits in the memory address can identify the bank within the pseudo channel that the memory address targets.

In an embodiment, when a memory controller sends a back pressure or forward pressure signal for its respective memory channel, the signal identifies the bank that is next to be refreshed with a value that corresponds to the value found in the bits of a memory address that targets the bank. The network interface logic circuitry 511 then enters this value into the bank ID field of the scoreboard space 512 that is reserved for the pseudo-channel whose memory controller sent the signal. If a forward pressure signal was sent, the network interface logic circuitry also asserts the forward pressure field (Fp) (the back pressure signal should be de-asserted). If a backward pressure signal was sent the network interface logic circuitry 511 asserts the back pressure field (Bp) and de-asserts the forward pressure field (Fp).

By designing the network interface logic circuitry 511 to internally comprehend which highest order bits of a memory address correspond to which pseudo channels, the network interface logic circuitry 511 can snoop the respective memory addresses of its resident memory requests (e.g. from moment of receipt through the queue entries) and identify those memory requests having a memory address whose bank identification bits match the bank ID bits in the scoreboard 512 for the pseudo channel that the highest ordered bits of the memory address correspond to.

For those memory requests exhibiting such a match, the logic refers to the forward pressure and back pressure status bits in the scoreboard 512. If the status of one of these signals is asserted in the scoreboard 512, the network interface logic circuitry implements the appropriate handling of the memory request. Specifically, if the forward pressure signal is asserted, the network logic circuitry 511 causes the request to be immediately sent into the network, or, if the back pressure signal is asserted, the network interface logic circuitry 511 does not allow the memory request to be sent into the network.

As discussed above with respect to inset 420 of FIG. 4, the memory controller 403 first asserts the forward pressure signal and then asserts the back pressure signal leading up to the refresh for a particular bank. In an embodiment, a de-assertion of the back pressure signal is also sent by the memory controller that identifies a bank after the bank that is being refreshed completes its refresh and is able to accept memory requests.

Upon receipt of this message, referring back to FIG. 5, the network interface logic circuitry 511 of the host interface 503 clears the forward and back pressure signals for the specified bank in the corresponding pseudo channel space of the scoreboard 512. This prompts the network interface logic circuitry 511 not to apply any forward or back pressure treatment on any memory request having a memory address with a bank ID that matches the bank ID in the scoreboard for the corresponding pseudo channel.

Upon the next bank to be refreshed for the pseudo channel reaching its forward pressure mark, the memory controller sends a new forward pressure signal that identifies the new bank and the process repeats.

As described at length above, the improvements described above can be applied to an HBM memory which is a stacked memory chip solution. In some embodiments, the host interfaces 305, network 304 and memory controllers 302 are all integrated on a same logic chip and the HBM memory stack is mounted on top of the logic chip. In other embodiments, the HBM memory stack is mounted on a same package substrate as the logic chip and both the logic chip and HBM memory stack are within the same semiconductor chip package (e.g., a single integrated heat spreader is mounted to the package substrate and covers both the logic chip and the HBM memory stack).

In still other embodiments at least one of the host interfaces 305, network 304 and memory controllers 302 are implemented with more than one semiconductor chip. The multiple semiconductor chips can all be integrated in the same chip package with the HBM memory, or, the HBM memory can be a separate packaged solution from one or more of these chips.

Note that the memory 301 need not be HBM memory and can be any large scale memory. For example, the different regions of memory 301 and their corresponding memory controllers 303 can be implemented with separate memory sleds that are plugged into a rack. The network 304 is implemented with the backplane of the rack and/or any other network that the rack is communicatively coupled to (such as within a data center). The host interfaces 305 are integrated in compute (CPU) sleds and/or accelerator (e.g., GPU) sleds that are plugged into the same rack or other racks and collect and forward into the network 304 the memory requests generated by their respective processing resources (e.g., CPUs, GPUs, etc.). Here, the above described disaggregated computing approach can be compliant with one or more Open Compute Project specification.

The host interfaces 305 can take on any of multiple interfaces irrespective of the system architecture implementation and need not be a disaggregated computing system (e.g., the aforementioned approaches in which the memory is in the same chip package as the chip(s) in which any of the host interfaces 305, network 304 and/or memory controllers 302 are integrated). Possible interfaces include any of Remote Direct Memory Access (RDMA), advanced eXtensible Interface (AXI), Peripheral Component Interface Exress (PCIe), NVlink; Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium.

The following discussion concerning FIGS. 6, 7 and 8 are directed to systems, data centers and rack implementations, generally. FIG. 6 generally describes possible features of an electronic system that can include the memory access architecture with forward and backward pressure signals as described at length above. FIG. 7 describes possible features of a data center that can include such electronic systems. FIG. 8 describes possible features of a rack having one or more such electronic systems installed into it.

FIG. 6 depicts an example system. System 600 includes processor 610, which provides processing, operation management, and execution of instructions for system 600. Processor 610 can include any type of microprocessor, central processing unit (CPU), graphics processing unit (GPU), processing core, or other processing hardware to provide processing for system 600, or a combination of processors. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors (NPUs) to perform such networking functions (e.g., in a pipelined fashion or otherwise).

In one example, system 600 includes interface 612 coupled to processor 610, which can represent a higher speed interface or a high throughput interface for system components that needs higher bandwidth connections, such as memory subsystem 620 or graphics interface components 640, or accelerators 642. Interface 612 represents an interface circuit, which can be a standalone component or integrated onto a processor die. Where present, graphics interface 640 interfaces to graphics components for providing a visual display to a user of system 600. In one example, graphics interface 640 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 640 generates a display based on data stored in memory 630 or based on operations executed by processor 610 or both. In one example, graphics interface 640 generates a display based on data stored in memory 630 or based on operations executed by processor 610 or both.

Accelerators 642 can be a fixed function offload engine that can be accessed or used by a processor 610. For example, an accelerator among accelerators 642 can provide compression (DC) capability, cryptography services such as public key encryption (PKE), cipher, hash/authentication capabilities, decryption, or other capabilities or services. In some embodiments, in addition or alternatively, an accelerator among accelerators 642 provides field select controller capabilities as described herein. In some cases, accelerators 642 can be integrated into a CPU socket (e.g., a connector to a motherboard or circuit board that includes a CPU and provides an electrical interface with the CPU). For example, accelerators 642 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 642 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 620 represents the main memory of system 600 and provides storage for code to be executed by processor 610, or data values to be used in executing a routine. Memory subsystem 620 can include one or more memory devices 630 such as read-only memory (ROM), flash memory, volatile memory, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software functionality to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014), HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

The memory resources can also be tiered (different access times are attributed to different regions of memory), disaggregated (memory is a separate (e.g., rack pluggable) unit that is accessible to separate (e.g., rack pluggable) CPU units), and/or remote (e.g., memory is accessible over a network).

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 600 includes interface 614, which can be coupled to interface 612. In one example, interface 614 represents an interface circuit, which can include stand-alone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can transmit data to a remote device, which can include sending data stored in memory. Network interface 650 can receive data from a remote device, which can include storing received data into memory. Various embodiments can be used in connection with network interface 650, processor 610, and memory subsystem 620.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, or optical based disks, or a combination. Storage 684 holds code or instructions and data in a persistent state (e.g., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (e.g., the value or state of the data is indeterminate if power is interrupted to system 600). In one example, storage subsystem 680 includes controller 682 to interface with storage 684. In one example controller 682 is a physical part of interface 614 or processor 610 or can include circuits in both processor 610 and interface 614.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 600. More specifically, power source typically interfaces to one or multiple power supplies in system 600 to provide power to the components of system 600. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 600 can be implemented as a disaggregated computing system. For example, the system 600 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 6, other types of systems to which the above described invention can be applied and are also partially or wholly described by FIG. 6 are communication systems such as routers, switches, and base stations.

FIG. 7 depicts an example of a data center. Various embodiments can be used in or with the data center of FIG. 7. As shown in FIG. 7, data center 700 may include an optical fabric 712. Optical fabric 712 may generally include a combination of optical signaling media (such as optical cabling) and optical switching infrastructure via which any particular sled in data center 700 can send signals to (and receive signals from) the other sleds in data center 700. However, optical, wireless, and/or electrical signals can be transmitted using fabric 712. The signaling connectivity that optical fabric 712 provides to any given sled may include connectivity both to other sleds in a same rack and sleds in other racks.

Data center 700 includes four racks 702A to 702D and racks 702A to 702D house respective pairs of sleds 704A-1 and 704A-2, 704B-1 and 704B-2, 704C-1 and 704C-2, and 704D-1 and 704D-2. Thus, in this example, data center 700 includes a total of eight sleds. Optical fabric 712 can provide sled signaling connectivity with one or more of the seven other sleds. For example, via optical fabric 712, sled 704A-1 in rack 702A may possess signaling connectivity with sled 704A-2 in rack 702A, as well as the six other sleds 704B-1, 704B-2, 704C-1, 704C-2, 704D-1, and 704D-2 that are distributed among the other racks 702B, 702C, and 702D of data center 700. The embodiments are not limited to this example. For example, fabric 712 can provide optical and/or electrical signaling.

FIG. 8 depicts an environment 800 that includes multiple computing racks 802, each including a Top of Rack (ToR) switch 804, a pod manager 806, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 808, and INTEL® ATOM™ pooled compute drawer 810, a pooled storage drawer 812, a pooled memory drawer 814, and a pooled I/O drawer 816. Each of the pooled system drawers is connected to ToR switch 804 via a high-speed link 818, such as a 40 Gigabit/second (Gb/s) or 100 Gb/s Ethernet link or an 100+ Gb/s Silicon Photonics (SiPh) optical link. In one embodiment high-speed link 818 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 800 may be interconnected via their ToR switches 804 (e.g., to a pod-level switch or data center switch), as illustrated by connections to a network 820. In some embodiments, groups of computing racks 802 are managed as separate pods via pod manager(s) 806. In one embodiment, a single pod manager is used to manage all of the racks in the pod. Alternatively, distributed pod managers may be used for pod management operations. RSD environment 800 further includes a management interface 822 that is used to manage various aspects of the RSD environment. This includes managing rack configuration, with corresponding parameters stored as rack configuration data 824.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a memory controller having a network interface and a channel interface, the channel interface to send read, write and refresh commands into a region of a memory, the network interface to receive memory access requests from a network, wherein the memory access requests target the region of the memory, the memory access requests sent into the network by one or more host interfaces, the memory controller comprising bank refresh logic circuitry, the memory controller comprising signaling logic circuitry to send a back pressure signal to the one or more host interfaces, the back pressure signal identifying a bank of the region of the memory that is about to be refreshed by the bank refresh logic circuitry, the back pressure signal to inform the one or more host interfaces that any memory requests that target the bank will not be serviced by the region of memory before the bank begins to be refreshed.

2. The apparatus of claim 1 wherein the memory is an HBM memory compatible with a JEDEC High Bandwidth Memory (HBM) standard.

3. The apparatus of claim 2 wherein the signaling logic circuitry is also to send a forward pressure signal to the one or more host interfaces before the back pressure signal, the forward pressure signal to inform the one or more host interfaces that any memory requests that target the bank will be serviced by the region of memory before the bank begins to be refreshed.

4. The apparatus of claim 3 wherein the apparatus further comprises the host interfaces, the host interfaces comprising logic circuitry that maintains a status of the back pressure and forward pressure signals for a particular bank of the region of the memory, the particular bank identified to the logic circuitry by the signaling logic circuitry.

5. The apparatus of claim 2 wherein the memory controller and the HBM memory are within a same semiconductor chip package.

6. The apparatus of claim 1 wherein the signaling logic circuitry is also to send a forward pressure signal to the one or more host interfaces before the back pressure signal, the forward pressure signal to inform the one or more host interfaces that any memory requests that target the bank will be serviced by the region of memory before the bank begins to be refreshed.

7. The apparatus of claim 1 wherein the apparatus further comprises the host interfaces, the host interfaces comprising logic circuitry that maintains a status of the back pressure and forward pressure signals for a particular bank of the region of the memory, the particular bank identified to the logic circuitry by the signaling logic circuitry.

8. A computer system, comprising:
a plurality of processors communicatively coupled to a plurality of host interfaces to a memory;
a network communicatively coupled to the plurality of host interfaces;
a plurality of memory controllers coupled to the network, the memory divided into regions, each one of the memory controllers dedicated to a different one of the regions, a memory controller of the memory controllers comprising bank refresh logic circuitry and signaling logic circuitry, the signaling logic circuitry to send a back pressure signal to the plurality of host interfaces, the back pressure signal identifying a bank of one of the regions of the memory that is about to be refreshed by the bank refresh logic circuitry, the back pressure signal to inform the plurality of host interfaces that any memory requests that target the bank will not be serviced by the one of the regions of memory before the bank begins to be refreshed.

9. The computer system of claim 8 wherein the memory is an HBM memory compatible with a JEDEC High Bandwidth Memory (HBM) standard.

10. The computer system of claim 9 wherein the signaling logic circuitry is also to send a forward pressure signal to the plurality of host interfaces before the back pressure signal, the forward pressure signal to inform the plurality of host interfaces that any memory requests that target the bank will be serviced by the one of the regions of memory before the bank begins to be refreshed.

11. The computer system of claim 9 wherein the memory controller and the HBM memory are within a same semiconductor chip package.

12. The computer system of claim 8 wherein the signaling logic circuitry is also to send a forward pressure signal to the plurality of host interfaces before the back pressure signal, the forward pressure signal to inform the plurality of host interfaces that any memory requests that target the bank will be serviced by the one of the regions of memory before the bank begins to be refreshed.

13. The computer system of claim 8 wherein the plurality of processors are implemented with compute sleds and/or accelerator sleds and the memory controllers and memory are implemented with memory sleds.

14. The computer system of claim 13 wherein the plurality of host interfaces implement any of the following interfaces:
RDMA;
AXI;
PCIe;
CXL;
CAPI;
CCIX;
NVLink;
Open CAPI.

15. An apparatus, comprising:
a plurality of host interfaces to a memory;
a network communicatively coupled to the plurality of host interfaces;
a plurality of memory controllers coupled to the network, the memory divided into regions, each one of the memory controllers dedicated to a different one of the regions, a memory controller of the memory controllers comprising bank refresh logic circuitry and signaling logic circuitry, the signaling logic circuitry to send a back pressure signal to the plurality of host interfaces, the back pressure signal identifying a bank of one of the regions of the memory that is about to be refreshed by the bank refresh logic circuitry, the back pressure signal to inform the plurality of host interfaces that any memory requests that target the bank will not be serviced by the one of the regions of memory before the bank begins to be refreshed.

16. The apparatus of claim 15 wherein the memory is an HBM memory compatible with a JEDEC High Bandwidth Memory (HBM) standard.

17. The apparatus of claim 16 wherein the signaling logic circuitry is also to send a forward pressure signal to the plurality of host interfaces before the back pressure signal, the forward pressure signal to inform the plurality of host interfaces that any memory requests that target the bank will be serviced by the one of the regions of memory before the bank begins to be refreshed.

18. The apparatus of claim 16 wherein the memory controller and the HBM memory are within a same semiconductor chip package.

19. The apparatus of claim 15 wherein the signaling logic circuitry is also to send a forward pressure signal to the plurality of host interfaces before the back pressure signal, the forward pressure signal to inform the plurality of host interfaces that any memory requests that target the bank will be serviced by the one of the regions of memory before the bank begins to be refreshed.

20. The apparatus of claim 15 wherein the plurality of host interfaces implement any of the following interfaces:
   RDMA;
   AXI;
   PCIe;
   CXL;
   CAPI;
   CCIX;
   NVLink;
   Open CAPI.

* * * * *